United States Patent
Kuge et al.

(10) Patent No.: US 9,475,651 B2
(45) Date of Patent: Oct. 25, 2016

(54) MECHANISM FOR AND METHOD OF CORRECTING YAWING OF CONVEYED WORKPIECE

(71) Applicant: KAWASAKI JUKOGYO KABUSHIKI KAISHA, Kobe-shi, Hyogo (JP)

(72) Inventors: Morimasa Kuge, Kobe (JP); Hideyuki Tanaka, Kobe (JP); Osami Oogushi, Kobe (JP); Kentaro Azuma, Kobe (JP); Mutsuhiro Nakazawa, Kobe (JP); Kazunori Takahara, Kobe (JP)

(73) Assignee: KAWASAKI JUKOGYO KABUSHIKI KAISHA, Kobe-Shi (JP)

( * ) Notice: Subject to any disclaimer, the term of this patent is extended or adjusted under 35 U.S.C. 154(b) by 364 days.

(21) Appl. No.: 14/361,975

(22) PCT Filed: Nov. 19, 2012

(86) PCT No.: PCT/JP2012/007403
§ 371 (c)(1),
(2) Date: May 30, 2014

(87) PCT Pub. No.: WO2013/080480
PCT Pub. Date: Jun. 6, 2013

(65) Prior Publication Data
US 2014/0339740 A1    Nov. 20, 2014

(30) Foreign Application Priority Data

Nov. 30, 2011    (JP) ................. 2011-262025

(51) Int. Cl.
| | |
|---|---|
| B65G 47/24 | (2006.01) |
| H01L 21/677 | (2006.01) |
| H01L 21/68 | (2006.01) |
| B65G 49/06 | (2006.01) |

(52) U.S. Cl.
CPC ............ *B65G 47/24* (2013.01); *B23K 26/364* (2015.10); *B65G 49/061* (2013.01); *B65G 49/064* (2013.01); *H01L 21/67706* (2013.01); *H01L 21/68* (2013.01); *B65G 2249/02* (2013.01)

(58) Field of Classification Search
CPC .. B65G 47/24; B65G 49/061; B65G 49/064; B65G 2249/02; B23K 26/364; H01L 21/67706; H01L 21/68
See application file for complete search history.

(56) References Cited

U.S. PATENT DOCUMENTS

2006/0154551 A1*  7/2006  Nakanishi ............ B65G 49/061
                                                                  445/24

FOREIGN PATENT DOCUMENTS

| JP | A-2009-128830 | 6/2009 |
|---|---|---|
| JP | A-2010-060990 | 3/2010 |

OTHER PUBLICATIONS

Feb. 19, 2013 International Search Report issued in International Application No. PCT/JP2012/007403.

*Primary Examiner* — Galen Hauth
(74) *Attorney, Agent, or Firm* — Oliff PLC

(57) ABSTRACT

A holding device to hold a side portion of a conveyed workpiece; a running device to convey the holding device in a feeding direction along a rail; and a support mechanism to support the holding device at front portion and rear portions of the mechanism. Eccentric shafts are with the holding device at respective positions, at one position, one of front and rear portions is eccentric in the feeding direction by a predetermined amount relative to one drive shaft's axis included in the running device. At the other position, one of front and rear portions is eccentric crossing the workpiece feeding direction by a predetermined amount relative to one drive shaft's axis in the running device. The yawing occurring while the workpiece is conveyed, is corrected by rotating the axes of eccentric shafts axes such the holding device moves relative to the running device's position.

6 Claims, 14 Drawing Sheets

MECHANISM FOR AND METHOD OF CORRECTING YAWING OF CONVEYED WORKPIECE

TECHNICAL FIELD

The present invention relates to a mechanism for and method of correcting yawing of a conveyed workpiece.

BACKGROUND ART

Conventionally, workpieces are conveyed in the process of manufacturing, for example, various plate-shaped products. Particularly in the case of processing a workpiece while the workpiece is being conveyed, it is necessary that the workpiece (hereinafter, "conveyed workpiece") be in a proper orientation while being conveyed.

Examples of such a conveyed workpiece include a substrate of a thin silicon solar cell and a substrate of a CIGS solar cell. (These types of solar cells are collectively referred to as "thin-film solar cells" in the description and claims herein.) Such a substrate is formed in the following manner: forming a metal film or a semiconducting material film such as a silicon film on one surface of a glass substrate (i.e., deposition or film formation), thereby forming a thin-film layer (having a thickness of, for example, several hundred nm to several tens of μm) on the one surface of the glass substrate. Hereinafter, a description is given by taking a thin-film solar cell substrate as one example of the conveyed workpiece.

For example, as shown in FIGS. 12A to 12G, a process of manufacturing a thin-film solar cell substrate includes forming, on the upper surface of a glass substrate 100 (FIG. 12A), a transparent electrode layer 101 (FIG. 12B), and performing patterning on the transparent electrode layer 101 by irradiating the transparent electrode layer 101 with a laser beam 108 emitted from a laser machining device, thereby forming machining lines 102 in the transparent electrode layer 101 (FIG. 12C). The conveyed workpiece 107, including the transparent electrode layer 101 in which the machining lines 102 have been formed, is further processed such that a photoelectric conversion layer 103 is formed on the upper surface of the transparent electrode layer 101 (FIG. 12D), and photoelectric conversion layer machining lines 104 are formed in the photoelectric conversion layer 103 by a laser machining device (FIG. 12E). Thereafter, the conveyed workpiece 107, including the photoelectric conversion layer 103 in which the machining lines 104 have been formed, is further processed such that a back surface electrode layer 105 is formed on the upper surface of the photoelectric conversion layer 103 (FIG. 12F). Then, back surface electrode layer machining lines 106 are formed in the back surface electrode layer 105 by a laser machining device (FIG. 12G). The substrate 100, on which the pattering has been thus performed, is completed as a solar cell module.

As described above, in the case of a thin-film solar cell, film forming is performed on the surface of the conveyed workpiece (substrate 100) a plurality of times, and precise patterning needs to be performed on each of the formed thin-film layers. The required precision is, for example, error control in units of micrometers. Therefore, a laser machining device capable of precisely conveying a conveyed workpiece and precisely irradiating a thin-film layer of the conveyed workpiece with a laser beam is required.

One example of such a laser machining device is a laser machining device for which the applicant of the present application previously filed a patent application. As shown in FIG. 13, a laser machining device 110 is configured to hold and feed a conveyed workpiece 107 in a workpiece feeding direction X with a constant-speed feeder 111, and while feeding the conveyed workpiece 107, irradiate the conveyed workpiece 107 with a laser beam 108, which is emitted from a beam scanning unit 109 and scanned in a scanning direction Y, thereby performing patterning on the conveyed workpiece 107. The constant-speed feeder 111 includes a rotating shaft (θ axis) rotatable in a planar direction so that yawing and the like of the conveyed workpiece 107 can be corrected. Moreover, the laser machining device 110 includes a camera 113 configured to detect a machining reference position (e.g., an end face) of the conveyed workpiece 107.

Further, as shown in FIG. 14, while feeding the conveyed workpiece 107 in the workpiece feeding direction X, the laser machining device 110 emits a single laser beam 108 and scans the single laser beam 108 in the scanning direction Y, which crosses the workpiece feeding direction X, at a high speed (e.g., several times faster than a conventional speed). In this manner, patterning of forming straight machining lines 112 on the conveyed workpiece 107 perpendicularly to the feeding direction X can be performed.

As one example of this kind of conventional art, there is a substrate processing apparatus configured to perform a process while moving a glass substrate or the like and a substrate processor relative to each other, the substrate processor being configured to perform a predetermined process on the substrate. The substrate processing apparatus is configured to: measure an error that occurs during scanning of the substrate, such as yawing, in a first direction and a second direction perpendicular to the first direction; correct the error in the first direction by a corrector configured to control the conveyance of the substrate; and correct the error in the second direction by the substrate processor based on a measured distance. By performing the correction, the substrate processing apparatus can precisely perform the process at a predetermined position on the substrate (see Patent Literature 1, for example).

Another example of the conventional art is a panel substrate manufacturing method, in which a display panel substrate of a liquid crystal display or the like is irradiated with a light beam, and thereby a pattern is drawn on the substrate. The method includes: detecting a running error of a stage, the stage being configured to hold the substrate and run together with the substrate; correcting coordinates of drawing data based on results of the detection; and feeding the corrected drawing data to a drive circuit of a light beam emitting device (see Patent Literature 2, for example).

CITATION LIST

Patent Literature

PTL 1: Japanese Laid-Open Patent Application Publication No. 2009-128830
PTL 2: Japanese Laid-Open Patent Application Publication No. 2010-60990

SUMMARY OF INVENTION

Technical Problem

As described in Patent Literatures 1 and 2, while the conveyed workpiece is being conveyed, there is a case where yawing of rotating in a horizontal plane occurs. (The term "yawing" in the description and claims herein refers to movement causing "errors" such as "rotation in a horizontal plane and front-rear movement".) Therefore, if the yawing has occurred, the quality of the above-described patterning and the like degrades unless the yawing is corrected. For example, in the case of performing patterning at pitches of several tens of μm, yawing of even several μm causes a change in the distance between adjacent patterns, which affects the performance of the final product.

However, as shown in FIG. 15A, in Patent Literature 1, an error in an X-direction, yawing, and the like of a substrate 120, the substrate 120 being conveyed along rails 121 provided at both sides of the substrate 120, are detected by using a camera. Based on the detected data, error calculation is performed and a processing position of the substrate processor is corrected. Therefore, in this case, it takes time to precisely correct the processing position of the substrate processor. In addition, if this technique, in which yawing and the like are measured by using the camera and thereafter the processing position of the substrate processor is corrected, is applied to a device that is configured to scan a laser beam at a high speed to perform patterning, such as the above-described laser machining device 110, then the technique cannot allow for the high processing speed.

As shown in FIG. 15B, in Patent Literature 2, a running error of a stage 131 configured to hold a substrate 130 and run together with the substrate 130 is measured in X- and Y-directions, and drawing data is corrected based on results of the measurement. Based on the corrected drawing data, a pattern is drawn by the light beam emitting device. In this case, however, since the pattern drawing by the light beam emitting device is corrected based on the running error of the stage, it takes time to perform processing precisely. In addition, if this technique is applied to a device that is configured to scan a laser beam at a high speed to perform patterning, such as the above-described laser machining device 110, the technique cannot allow for the high processing speed.

As described above, in both the conventional art examples, the yawing and the like of the substrate are compensated for by correcting a position irradiated with the laser beam, and the like. Therefore, in a case where the laser machining device 110 shown in FIG. 13, for which the applicant of the present application previously filed a patent application, is used to perform patterning by scanning a laser beam at a very high speed in the scanning direction Y while feeding the conveyed workpiece 107 in the workpiece feeding direction X as shown in FIG. 14, the positioning of the laser beam cannot be corrected based on the above-described conventional art. That is, in the case of using the laser machining device 110 configured to scan a laser beam at a high speed, the technique of detecting yawing of the conveyed workpiece 107 and compensating for the yawing by correcting a position irradiated with the laser beam cannot be applied.

Other than the above-described laser machining device 110, there are devices that are required to be able to, in a case where yawing and the like of a conveyed workpiece have occurred while conveying the workpiece, correct the errors not by controlling a laser beam but by controlling the position of the conveyed workpiece. One example of such a device is a device for processing and inspecting a flat panel or glass substrate for use in a liquid crystal display or the like.

Solution to Problem

In view of the above, an object of the present invention is to provide a mechanism for and method of correcting yawing of a conveyed workpiece, the yawing occurring while the workpiece is being conveyed, the mechanism and method being capable of correcting the yawing while conveying the workpiece.

In order to achieve the above object, a yawing correcting mechanism according to the present invention, which is a mechanism for correcting yawing of a conveyed workpiece conveyed in a workpiece feeding direction, includes: a holding device configured to hold a side portion of the conveyed workpiece; a running device configured to support the holding device and convey the holding device in the workpiece feeding direction along a rail; and a support mechanism configured to support the holding device at a front portion and a rear portion of the support mechanism, the front portion and the rear portion being arranged in the workpiece feeding direction of the running device. The support mechanism includes: rotating shafts included in one of the holding device and the running device; and eccentric shafts included in the other one of the holding device and the running device, the eccentric shafts including respective axes parallel to the corresponding rotating shafts. The axes of the eccentric shafts are disposed at respective positions such that, at one of the positions, one of the front portion and the rear portion is eccentric relative to an axis of the corresponding rotating shaft in the workpiece feeding direction by a predetermined eccentricity amount, and at the other position, the other one of the front portion and the rear portion is eccentric relative to an axis of the corresponding rotating shaft in a direction crossing the workpiece feeding direction by a predetermined eccentricity amount. The yawing correcting mechanism is configured to correct the yawing of the conveyed workpiece by rotating the axes of the eccentric shafts around the axes of the rotating shafts, such that the holding device moves relative to the running device. The term "axis" in the description and claims herein is a "central axis".

According to the above configuration, yawing of the conveyed workpiece held by the holding device, the yawing including rotation and front-rear movement of the workpiece and being caused due to yawing of the running device, linear precision of a running axis, and the like, is corrected in the following manner: rotating the eccentric shaft that is eccentric relative to the axis of the corresponding rotating shaft in the workpiece feeding direction by the predetermined eccentricity amount, and rotating the eccentric shaft that is eccentric relative to the axis of the corresponding rotating shaft in the direction crossing the workpiece feeding direction by the predetermined eccentricity amount, the rotating shafts being both included in the support mechanism configured to support the holding device at the front portion and the rear portion of the support mechanism, such that the position of the holding device moves relative to the position of the running device. This makes it possible to convey the workpiece while suppressing the yawing of the conveyed workpiece.

The eccentric shafts may be disposed such that one of the eccentric shafts is eccentric relative to the corresponding rotating shaft in the workpiece feeding direction, and the other eccentric shaft is eccentric relative to the corresponding rotating shaft in a direction perpendicular to the workpiece feeding direction.

According to this configuration, the correction of the yawing of the conveyed workpiece is divided into error correction in the workpiece feeding direction and error correction in the direction perpendicular to the workpiece feeding direction. This makes it possible to stably correct the yawing.

The running device may include a driver configured to rotate the rotating shafts. The holding device may include engagement portions engaged with the eccentric shafts. The driver may be configured to rotate the rotating shafts based on an eccentricity amount in a direction perpendicular to the workpiece feeding direction, the eccentricity amount being measured in advance between the running device and the rail, such that the eccentric shafts cause the holding device to move relative to the running device to correct the yawing of the conveyed workpiece.

According to this configuration, even if yawing of the running device occurs due to, for example, errors between the running device and the rail, the conveyed workpiece is not affected by the yawing since positional adjustment is made relative to the running device. Thus, the workpiece can be conveyed precisely.

A yawing correcting method according to the present invention is a method of correcting yawing of a conveyed workpiece conveyed in a workpiece feeding direction. The yawing correcting method includes: obtaining an amount of yawing of the conveyed workpiece between a conveyance start point and a conveyance end point; and correcting the yawing by causing a holding device to move relative to a running device based on the obtained amount of yawing of the conveyed workpiece. Correcting the yawing includes: performing correction in a direction crossing the workpiece feeding direction of the conveyed workpiece by rotating an eccentric shaft around a rotating shaft, the rotating shaft being included in one of the holding device and the running device, the holding device being configured to hold the conveyed workpiece, the running device being configured to convey the holding device in the workpiece feeding direction, the eccentric shaft being included in the other one of the holding device and the running device, the eccentric shaft being eccentric relative to the rotating shaft in the workpiece feeding direction by a predetermined eccentricity amount; and performing correction in the workpiece feeding direction of the conveyed workpiece by rotating an eccentric shaft around an axis of a rotating shaft, the rotating shaft being included in one of the holding device and the running device, the eccentric shaft being included in the other one of the holding device and the running device, the eccentric shaft being eccentric relative to the rotating shaft in the direction crossing the workpiece feeding direction by a predetermined eccentricity amount.

According to the above method, changes in the amount of yawing occurring while the conveyed workpiece is fed from the conveyance start point to the conveyance end point are obtained in advance. Based on the changes in the amount of yawing, the correction in the direction crossing the workpiece feeding direction and the correction in the workpiece feeding direction are performed on the conveyed workpiece fed from the conveyance start point to the conveyance end point, such that the position of the holding device moves relative to the position of the running device, and thereby the yawing is corrected. In this manner, even slight yawing can be precisely corrected.

The method may be such that the correction in the direction crossing the workpiece feeding direction is performed by rotating an axis of the eccentric shaft that is eccentric in the workpiece feeding direction around the axis of the corresponding rotating shaft, and thereafter the correction in the workpiece feeding direction is performed by rotating an axis of the eccentric shaft that is eccentric in the direction crossing the workpiece feeding direction around the axis of the corresponding rotating shaft.

According to the above method, an angular error due to the yawing of the conveyed workpiece is corrected first, and then an error in the workpiece feeding direction, the error remaining after the angular error has been corrected, is corrected. Therefore, the yawing of the conveyed workpiece can be corrected with simple math formulas.

Correcting the yawing may be performed during a process, the process including, while feeding a thin-film solar cell substrate as the conveyed workpiece in the workpiece feeding direction, performing laser beam patterning at a predetermined position on the conveyed workpiece to form a scribe line, such that the position on the conveyed workpiece, at which the patterning is performed, is corrected.

According to the above method, in a laser machining device configured to perform laser beam patterning to form a scribe line on the conveyed workpiece, which is a thin-film solar cell substrate, yawing that occurs while the conveyed workpiece is being conveyed can be precisely corrected, and thereby the scribe line can be precisely formed.

Advantageous Effects of Invention

The present invention makes it possible to provide a yawing correcting mechanism capable of correcting yawing of a conveyed workpiece while the workpiece is being conveyed, the yawing including rotation and front-rear movement of the workpiece and occurring while the workpiece is being conveyed.

BRIEF DESCRIPTION OF DRAWINGS

FIG. 5A is a plan view showing an eccentricity amount of a front portion; and FIG. 5B is a plan view showing an eccentricity amount of a rear portion.

DESCRIPTION OF EMBODIMENTS

Hereinafter, one embodiment of the present invention is described with reference to the drawings. In the embodiment below, the description is given by taking the substrate of a thin-film solar cell or the like as an example of a conveyed workpiece 5. The description below refers to a workpiece feeding direction X and a direction Y perpendicular to the workpiece feeding direction X.

Figure 1:
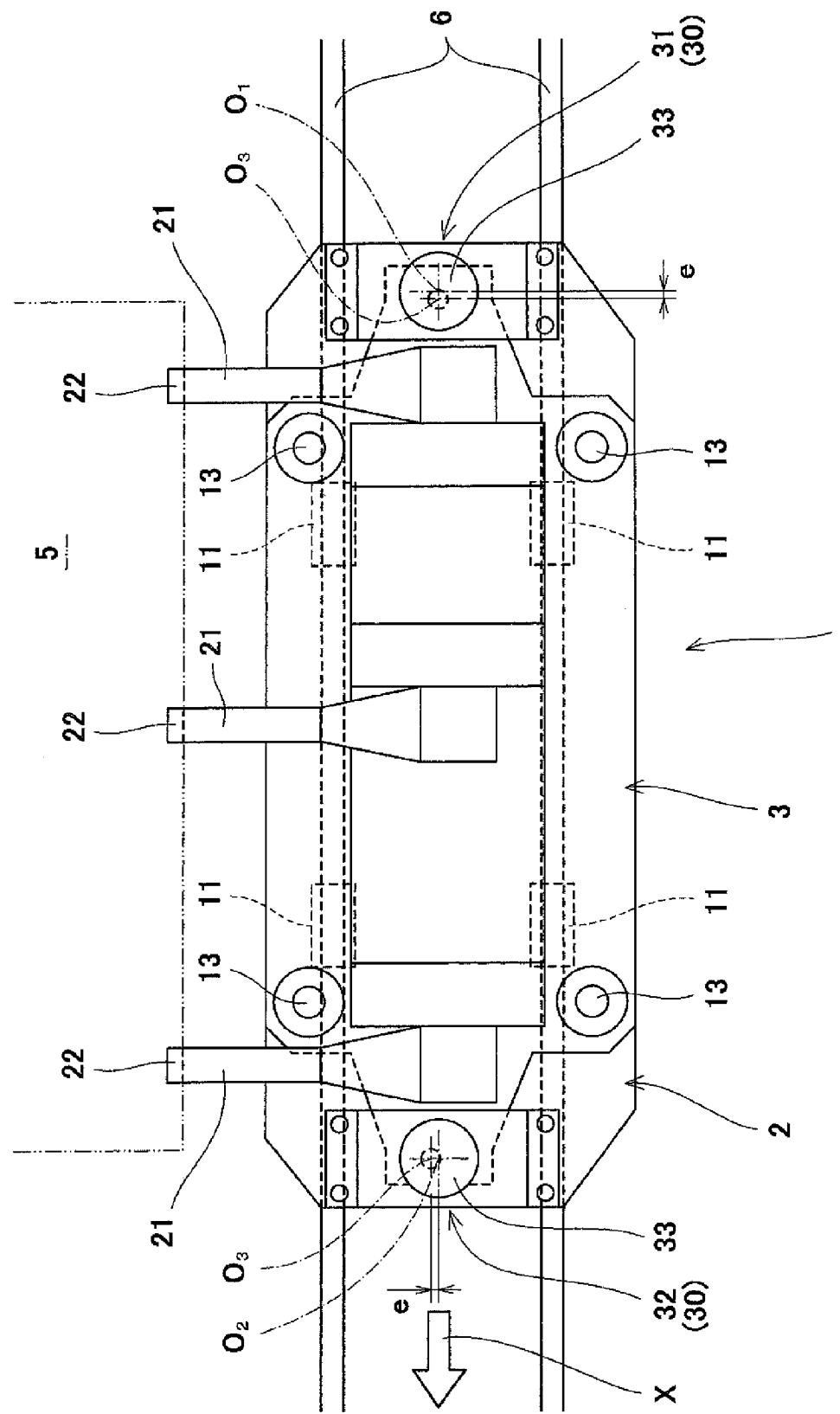
FIG. 1 is a plan view showing a conveying apparatus including a yawing correcting mechanism according to one embodiment of the present invention.
Figure 2:
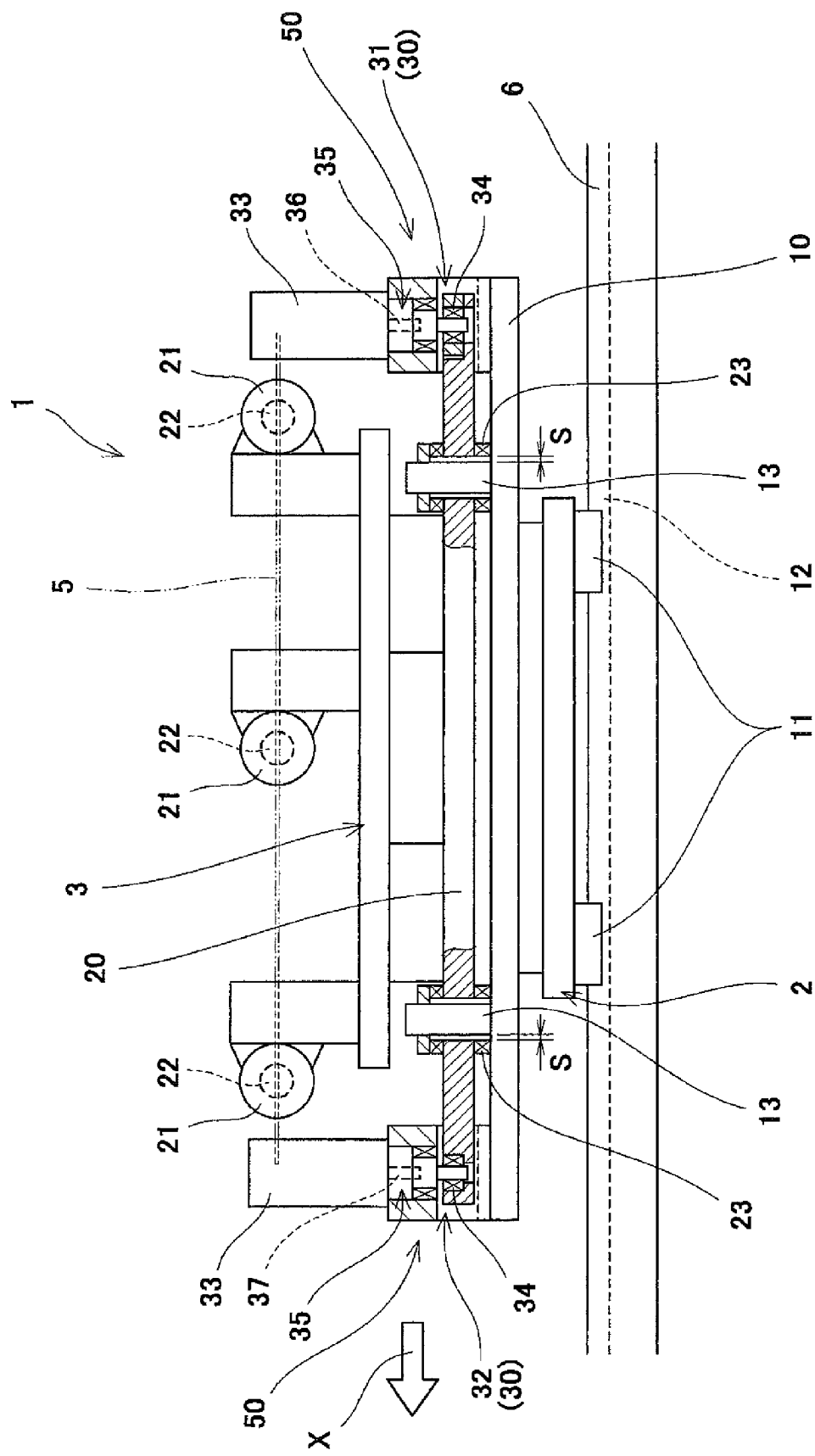
FIG. 2 is a partial sectional rear view of the conveying apparatus shown in FIG. 1.

As shown in FIGS. 1 and 2, a conveying apparatus 1 including a yawing correcting mechanism 50 according to the present embodiment is configured to move along two rails 6 in the workpiece feeding direction X. The conveying apparatus 1 includes: a running device 2 configured to run along the rails 6; and a holding device 3 supported on the upper part of the running device 2, the holding device 3 being configured to hold the conveyed workpiece 5 and move together with the running device 2.

The running device 2 includes a lower plate 10. At four positions of the lower part of the lower plate 10, four running guides 11 are provided, respectively. The running guides 11 are configured to slidingly move along the rails 6. The running guides 11 are engaged with the rails 6 at two front positions and two rear positions. The conveying apparatus 1 according to the present embodiment is configured to precisely move in the workpiece feeding direction X by means of a linear stepping motor 12 provided between the rails 6 and the running device 2.

The holding device 3 includes an upper plate 20 provided above the lower plate 10 of the running device 2. The upper plate 20 is provided with holding members 21. In this example, three holding members 21 are provided. The conveyed workpiece 5 is held by distal-end holders 22 of the respective holding members 21.

The holding device 3 includes restricting members 13, which are provided on the upper surface of the lower plate 10 of the running device 2. Owing to the restricting members 13, the amount of horizontal movement of the holding device 3 provided on the upper part of the running device 2 is restricted within a predetermined movement range. The restricting members 13 are columnar members fixed to the upper surface of the running device 2. In this example, four restricting members 13 are provided at four positions, respectively. Thrust bearings 23 are provided on the upper plate 20 of the holding device 3 in such a manner as to surround the restricting members 13. Accordingly, the holding device 3 is allowed to move in the horizontal direction within a range defined by gaps s formed between the thrust bearings 23 and the restricting members 13. The holding device 3 is supported on the upper part of the running device 2 via the thrust bearings 23, and thereby the holding device 3 is supported in such a manner that the holding device 3 is movable in the horizontal direction with very small frictional resistance.

A support mechanism 30, which is configured to support the holding device 3 on the upper part of the running device 2, is provided between the lower plate 10 of the running device 2 and the upper plate 20 of the holding device 3. The support mechanism 30 includes a rear support mechanism 31 and a front support mechanism 32, which are arranged in the workpiece feeding direction X. Each of the support mechanisms 31 and 32 includes: a driving motor (servomotor) 33 provided on the lower plate 10 of the running device 2; a support bearing 34 provided on the upper plate 20 of the holding device 3; and an eccentric shaft member 35 provided between the driving motor 33 and the support bearing 34. As described below, the eccentric shaft members 35 included in the respective rear and front support mechanisms 31 and 32 are rotatable around corresponding axes (central axes) $O_1$ and $O_2$ of drive shafts (rotating shafts) 36 and 37 of the driving motors 33.

Figure 3:
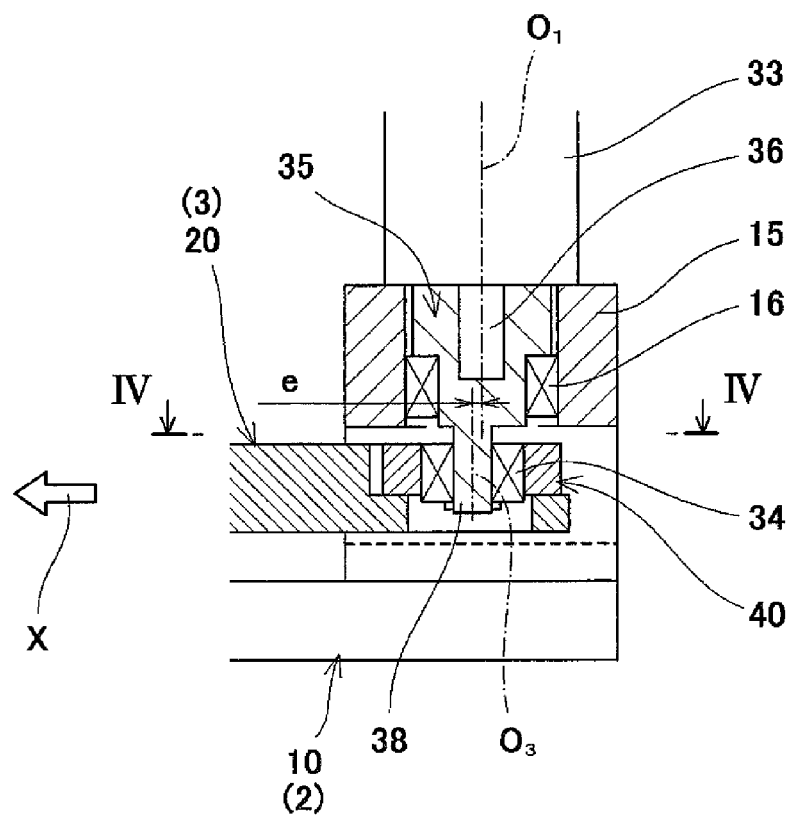
FIG. 3 is a sectional view showing part of a support mechanism of FIG. 2 in an enlarged manner.

With reference to FIG. 3, a description is given below by taking the rear support mechanism 31 as an example. As shown in FIG. 3, the driving motor 33 is provided such that the rear drive shaft 36 protrudes downward from a driver attachment plate 15 provided on the lower plate 10. The rear drive shaft 36 is a rotating shaft. The eccentric shaft member 35 is provided on the rear drive shaft 36. The eccentric shaft member 35 is supported by a bearing 16 provided on the driver attachment plate 15, and is rotatable around the axis $O_1$ of the rear drive shaft 36.

The eccentric shaft member 35 is provided with an eccentric shaft 38 protruding downward and having an axis (central axis) $O_3$. The axis $O_3$ is eccentric relative to the axis (central axis) $O_1$ of the rear drive shaft 36 of the driving motor 33 by a predetermined eccentricity amount e. The eccentric shaft 38 is inserted in the support bearing 34 provided on the upper plate 20 of the holding device 3.

Accordingly, when the driving motor 33 is driven and thereby the rear drive shaft 36 causes the eccentric shaft member 35 to rotate, the eccentric shaft 38 moves the upper plate 20 in the direction Y, which crosses the workpiece feeding direction X, at positions deviating from the axis $O_1$ with the predetermined eccentricity amount e. The movement is oscillation with respect to the axis $O_2$ of the drive shaft (rotating shaft) 37 of the front support mechanism 32. Thus, the rear of the holding device 3 can be moved relative to the running device 2 in the direction Y crossing the workpiece feeding direction X by an amount that corresponds to the predetermined eccentricity amount e.

Figure 4:
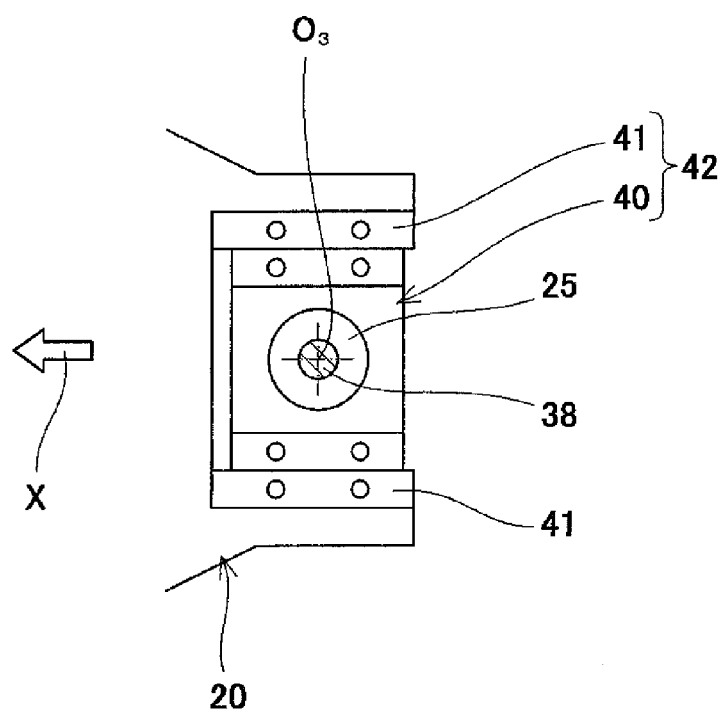
FIG. 4 is a plan view taken along line IV-IV of FIG. 3 as viewed in the direction of the arrows of line IV-IV.

When the rear of the upper plate 20 is caused to oscillate with respect to the axis $O_2$ of the drive shaft (rotating shaft) 37 of the front support mechanism 32 which does not become displaced relative to the running device 2, it is necessary to slightly move the rear drive shaft 36 of the rear support mechanism 31 in the workpiece feeding direction X. For this reason, as shown in FIG. 4, a sliding mechanism 42 is provided. In the sliding mechanism 42, a sliding member 40, which supports the eccentric shaft 38 of the eccentric shaft member 35 and the support bearing 34 supporting the eccentric shaft 38, is provided such that the sliding member 40 is slidable in the workpiece feeding direction X on the upper surface of the upper plate 20, and such that the sliding member 40 is movable in the workpiece feeding direction X along sliding guides 41 of the upper plate 20. Owing to the sliding mechanism 42, when the upper plate 20 is caused by the eccentric shaft member 35 to oscillate in the direction perpendicular to the workpiece feeding direction X, the rear of the upper plate 20 moves in the workpiece feeding direction X, and thereby displacement in the workpiece feeding direction X can be absorbed.

Figure 5A:
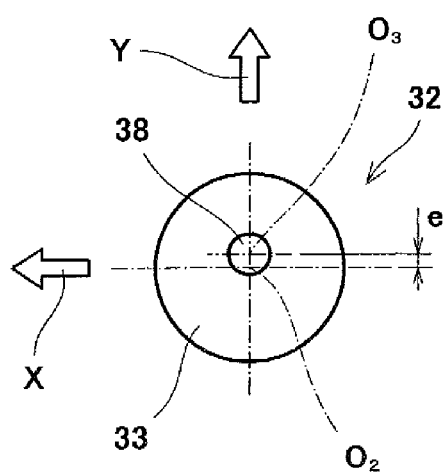
FIGS. 5A and 5B show axes in plan view, the axes being positioned in respective portions of the support mechanism of FIG. 3.
Figure 5B:
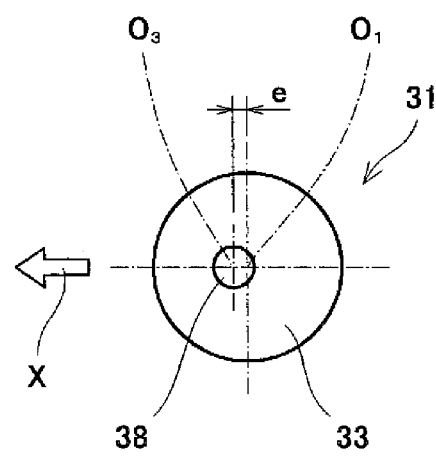

As shown in FIGS. 5A and 5B, the eccentric direction of the eccentric shaft 38 of the eccentric shaft member 35 is different between the rear support mechanism 31 and the front support mechanism 32. FIG. 5B shows the eccentric shaft 38 of the same rear support mechanism 31 as in FIG. 3. In FIG. 5B, the axis $O_3$ of the eccentric shaft 38 is eccentric relative to the axis $O_1$ (the axis of the rear drive shaft 36) of the driving motor 33 in a direction parallel to the workpiece feeding direction X by the predetermined eccentricity amount e. On the other hand, FIG. 5A shows the eccentric shaft 38 of the front support mechanism 32. In FIG. 5A, the axis $O_3$ of the eccentric shaft 38 is eccentric relative to the axis $O_2$ (the axis of the front drive shaft 37) of the driving motor 33 in the direction Y crossing (perpendicularly) the workpiece feeding direction X by the predetermined eccentricity amount e. The eccentricity amount e of these eccentric shaft members 35 is set to, for example, approximately 1 mm. Such setting makes it possible to correct slight yawing. The eccentricity amount e may be set in accordance with the amount of yawing and the like.

Hereinafter, a method of correcting yawing of the conveyed workpiece 5 is described with reference to FIGS. 6 to 10. Yawing of the conveyed workpiece 5 occurs due to, for example, errors in laying the rails 6 (FIG. 1) or manufacturing errors of components. Described below is a case where the conveying apparatus 1 running along the rails 6 yaws, and thereby the conveyed workpiece 5 held by the holding device 3 and conveyed by the conveying apparatus 1 yaws. In this example, the yawing of the conveyed workpiece 5 is corrected. It should be noted that, in the description below, the components shown in FIGS. 1 to 5 are denoted by common reference signs. In the drawings, errors of several μm to several hundred μm due to the yawing are shown in an exaggerated manner.

Figure 6:
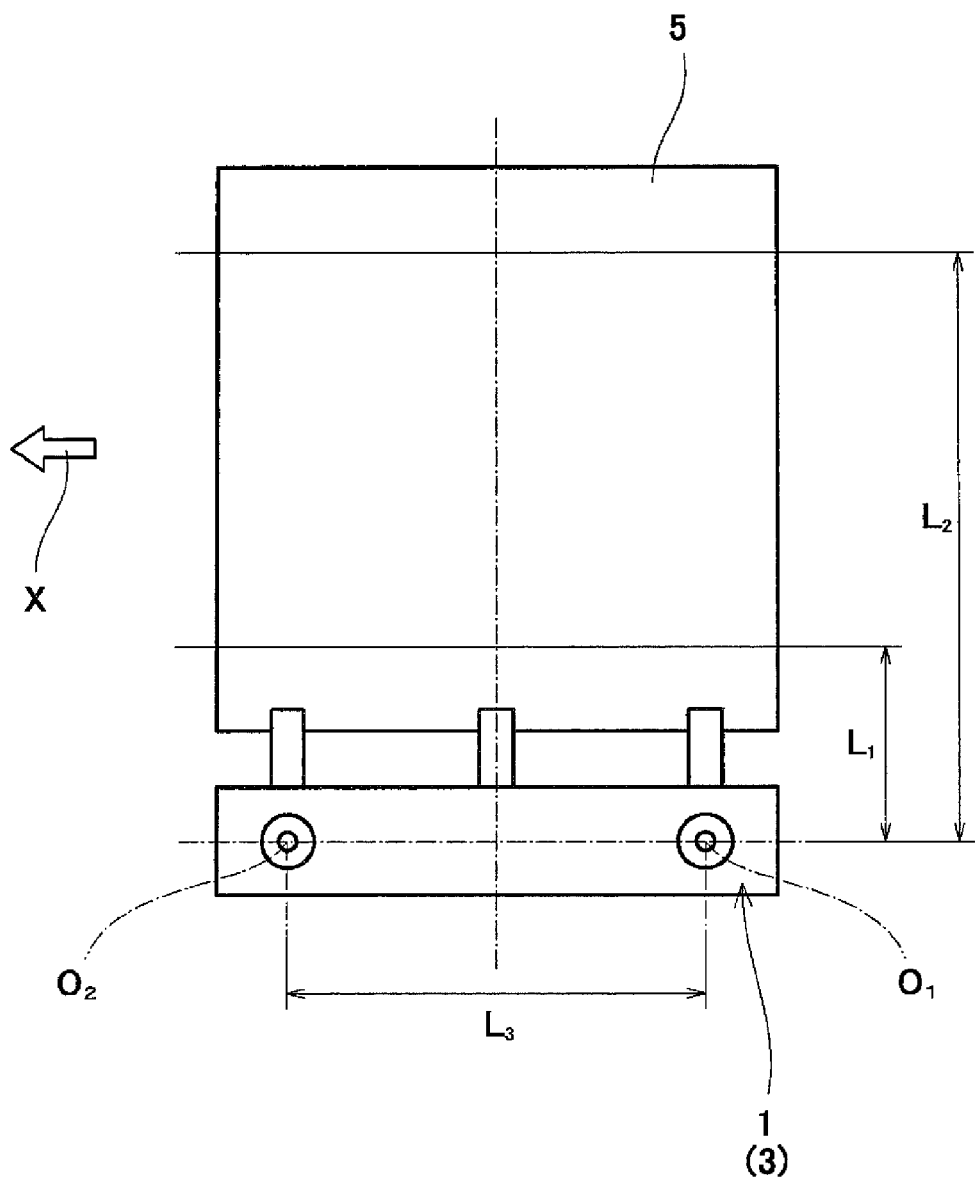
FIG. 6 is a plan view showing a relationship between the conveying apparatus of FIG. 1 and a conveyed workpiece.

As shown in FIG. 6, the positional relationship between the conveying apparatus 1 and the conveyed workpiece 5 is as follows:
$L_1$ represents a distance from a rotating shaft central axis position of the conveying apparatus 1 to a first error measurement point of the conveyed workpiece 5;
$L_2$ represents a distance from the rotating shaft central axis position of the conveying apparatus 1 to a second error measurement point of the conveyed workpiece 5; and
$L_3$ represents a distance between the front rotating shaft central axis and the rear rotating shaft central axis of the conveying apparatus 1.

Figure 7:
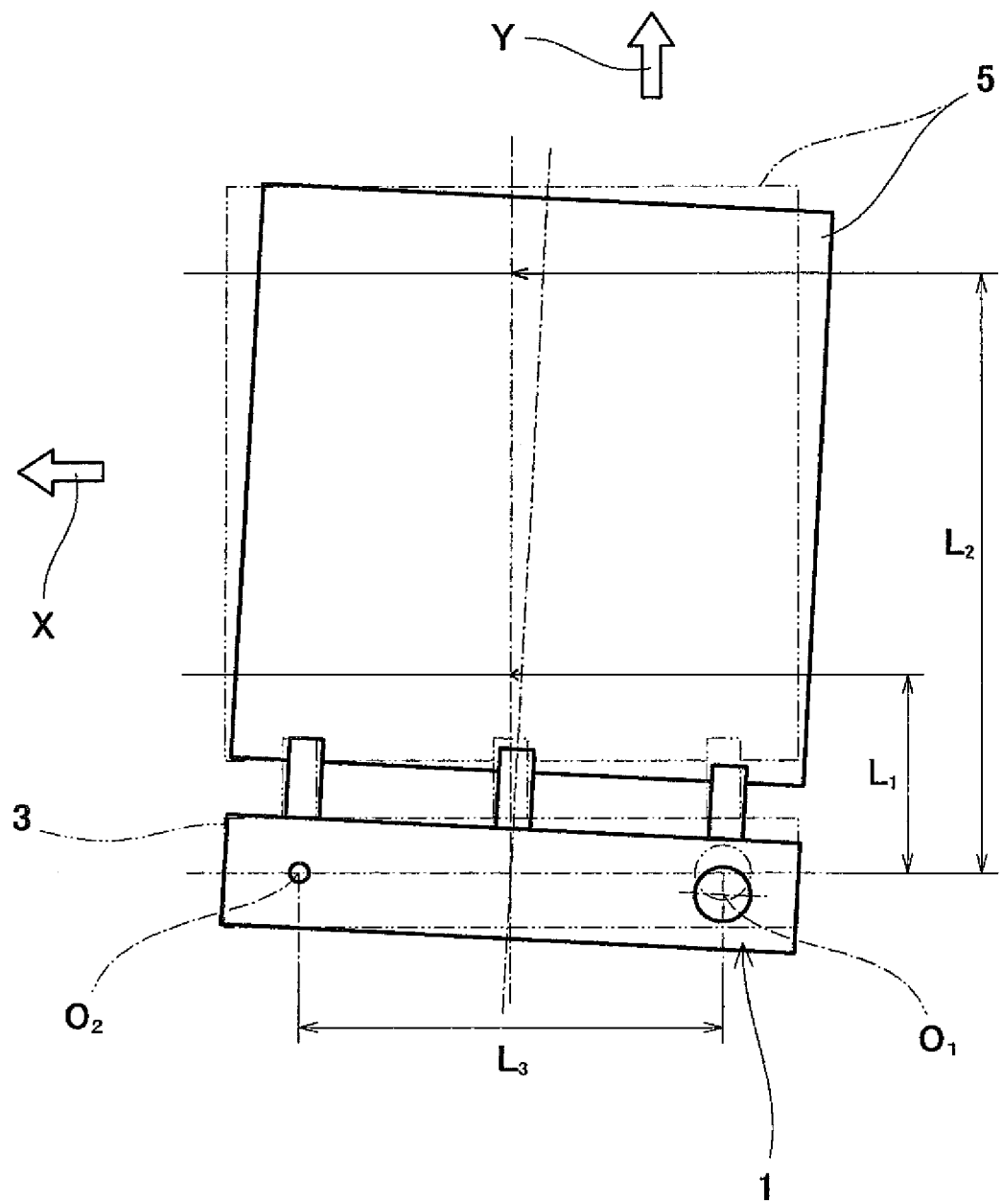
FIG. 7 is a plan view showing yawing of the conveyed workpiece of FIG. 6 in an exaggerated manner.
Figure 8:
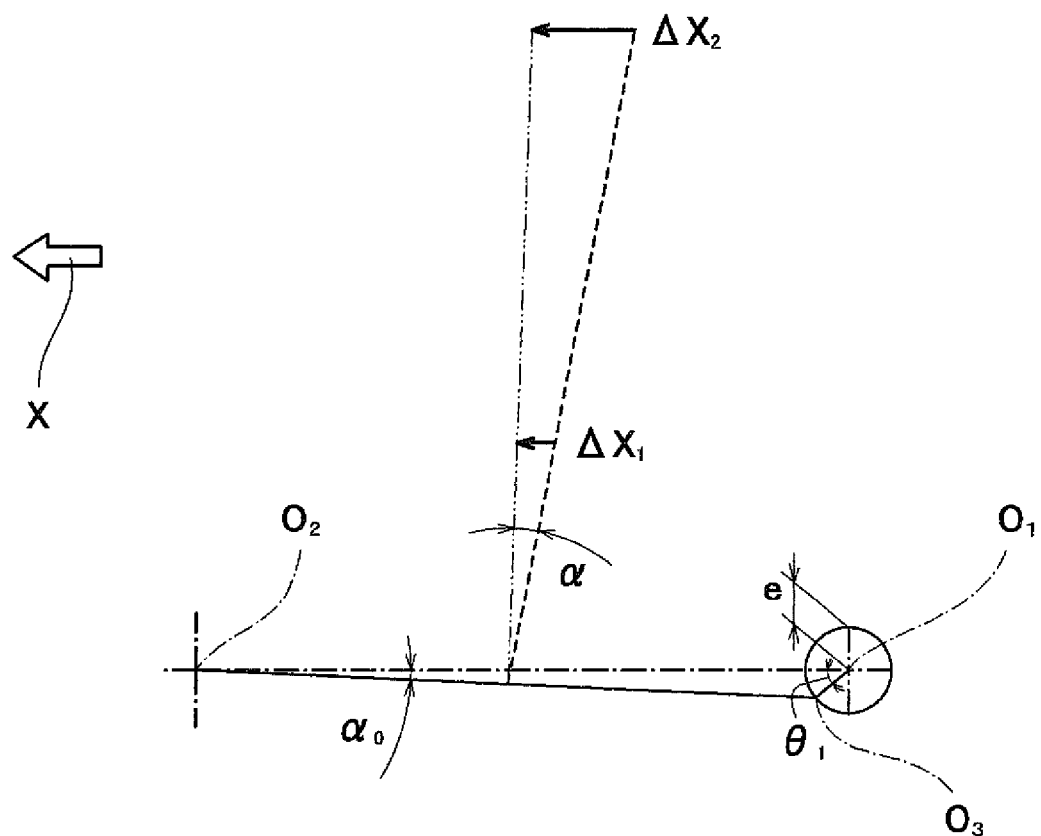
FIG. 8 is a plan view showing the concept of a method of correcting the yawing of the conveyed workpiece of FIG. 7.

As shown in FIGS. 7 and 8, the conveying apparatus 1 running in the workpiece feeding direction X along the rails 6 causes the conveyed workpiece 5 to yaw due to, for example, errors in laying the rails 6. For example, the yawing (FIG. 7 shows a state where angular displacement relative to the workpiece feeding direction X has occurred at the opposite side to the conveying apparatus 1) occurs due to, for example, errors in laying the rails 6 or manufacturing errors of components. The yawing occurs in the range of several μm to several tens of μm, for example. Sings used in FIG. 8 are as follows:
$\Delta X_1$ represents a workpiece conveyance error at the first error measurement point;
$\Delta X_2$ represents a workpiece conveyance error at the second error measurement point;
$\alpha_0$ represents the angle of the conveying apparatus 1;
e represents the eccentricity amount of the eccentric shaft 38; and
$\theta_1$ represents the rotation angle of the eccentric shaft 38.

Under the above conditions, the angle $\alpha_0$ of the conveying apparatus 1 is such that the eccentricity amount e of the eccentric shaft 38 (e.g., approximately 1 mm) is significantly less than the distance $L_3$ (e.g., approximately several hundred mm to one thousand and several hundred mm) between the front drive shaft 37 and the rear drive shaft 36. Accordingly, the eccentricity amount e can be considered as $e \ll L_3$, and a displacement in the workpiece feeding direction relative to the inclination angle $\alpha_0$ of the conveying apparatus 1 is represented by Math. 1 shown below.

$$\tan^{-1} \frac{e}{L_3} \approx 0 \qquad \text{[Math. 1]}$$

An angle α of the conveyed workpiece 5 can be obtained from Math. 2 shown below.

$$\tan\alpha = \frac{e \times \sin\theta_1}{L_3 - e \times \cos\theta_1} \qquad \text{[Math. 2]}$$

Since $\theta_1$ in Math. 2 is very small, based on the relationship of $e \ll L_3$, the displacement tan α of the conveyed workpiece 5 can be considered to be represented by Math. 3 or Math. 4 shown below.

$$\tan\alpha = \frac{e \times \sin\theta_1}{L_3 - e \times \cos\theta_1} \approx \frac{e \times \theta_1}{L_3 - e} \approx \frac{e \times \theta_1}{L_3} \qquad \text{[Math. 3]}$$

$$\tan\alpha \approx \sin\alpha \approx \alpha(\text{rad}) \approx \frac{e \times \theta_1}{L_3} \qquad \text{[Math. 4]}$$

Based on the displacement of the conveyed workpiece 5, the workpiece conveyance error $\Delta X_1$ regarding the distance $L_1$ to the first error measurement point of the conveyed workpiece 5 can be obtained by Math. 5 shown below.

$$\Delta X_1 = L_1 \times \tan\alpha = L_1 \times \frac{e \times \theta_1}{L_3} \qquad \text{[Math. 5]}$$

Similarly, the workpiece conveyance error $\Delta X_2$ regarding the distance $L_2$ to the second error measurement point can be obtained by Math. 6 shown below.

$$\Delta X_2 = L_2 \times \tan\alpha = L_2 \times \frac{e \times \theta_1}{L_3} \qquad \text{[Math. 6]}$$

Based on these errors $\Delta X_1$ and $\Delta X_2$, the correction angle $\theta_1$ at the position of the eccentric shaft member 35 can be obtained by Math. 7 shown below.

$$\theta_1 = \frac{L_3 \times (\Delta X_1 - \Delta X_2)}{e \times (L_1 - L_2)} \qquad \text{[Math. 7]}$$

Figure 13:
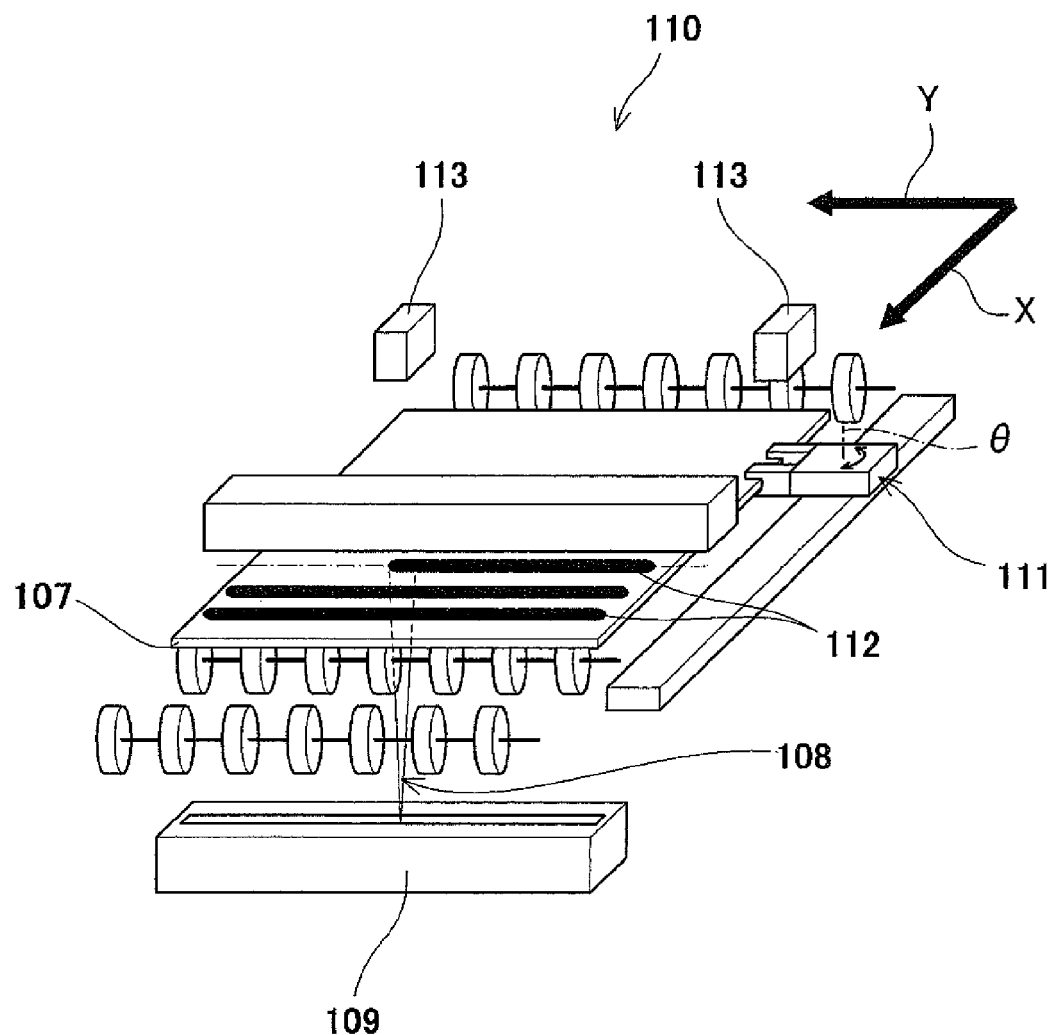
FIG. 13 is a perspective view of a laser machining device for which the applicant of the present application previously filed a patent application.
Figure 14:
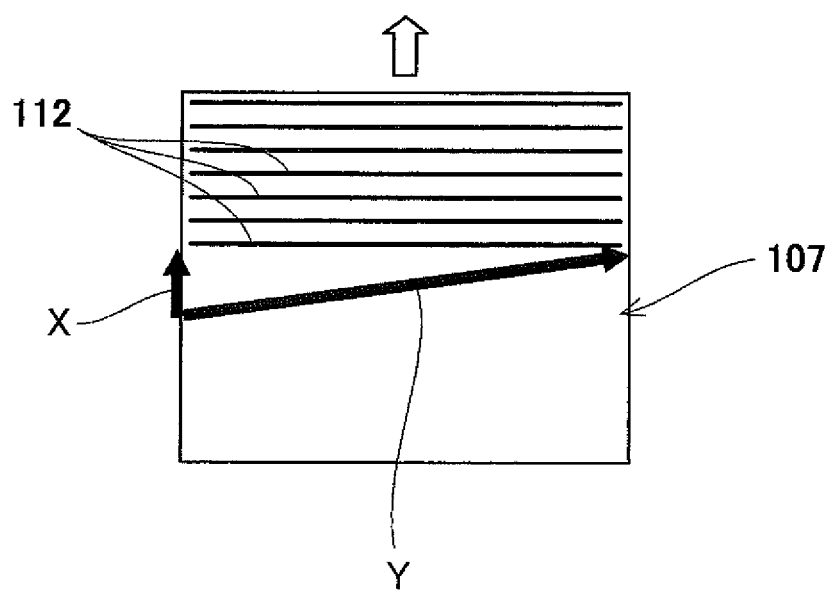
FIG. 14 is a plan view showing an example of patterning performed by the laser machining device of FIG. 13.
Figure 15A:
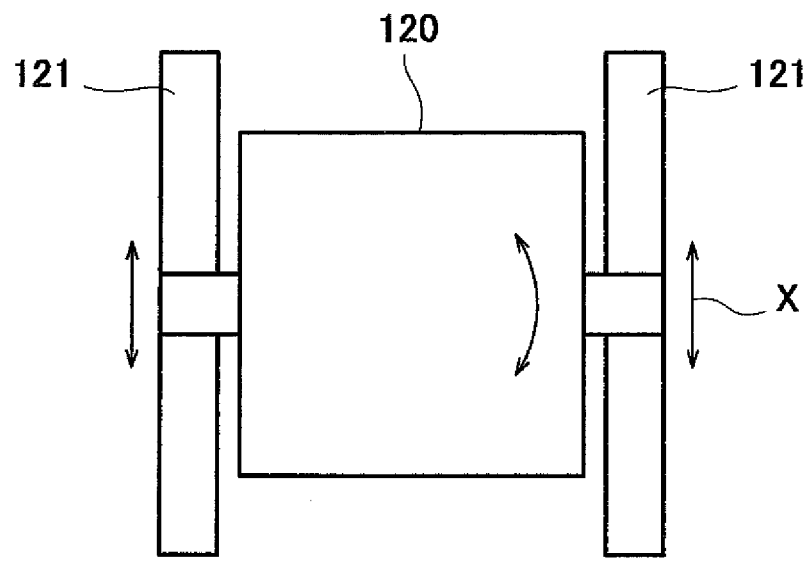
FIGS. 15A and 15B are plan views schematically showing an example of conventional yawing correction of a conveyed workpiece.
Figure 15B:
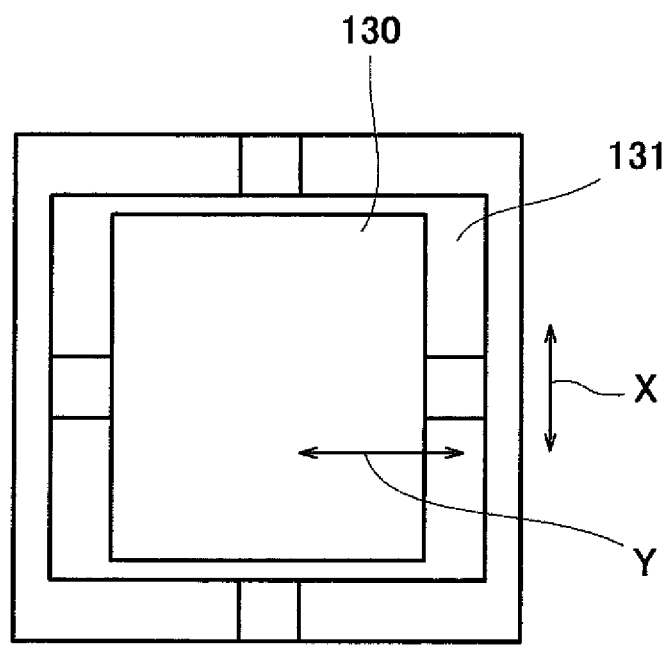

The correction as described above can be performed in the following manner: dividing the conveyance distance of the conveyed workpiece 5 (i.e., the moving distance of the conveying apparatus 1) into a plurality of pitches; measuring in advance the errors $\Delta X_1$ and $\Delta X_2$ at each position corresponding to the respective divided pitch; and calculating the correction angle $\theta_1$ at each position corresponding to the respective divided pitch by using Math. 7. The errors $\Delta X_1$ and $\Delta X_2$ at each position corresponding to the respective divided pitch can be measured in the following manner: conveying the conveyed workpiece 5 by the conveying apparatus 1; and measuring the displacement of the conveyed workpiece 5 at each position corresponding to the respective pitch of the conveyance distance by a laser length measuring machine (e.g., a displacement sensor; see FIG. 13), thereby measuring the errors $\Delta X_1$ and $\Delta X_2$. By measuring the errors in advance by a laser length measuring machine, the correction angle $\theta_1$, which is determined by the distance between the rails 6, the positions of the running guides 11, the position of the axis (central axis) $O_1$ of the rear drive shaft (rotating shaft) 36, the position of the axis (central axis) $O_2$ of the front drive shaft (rotating shaft) 37, and the like, can be calculated in accordance with conditions of the conveying apparatus 1.

Accordingly, by correcting the angle $\theta_1$ at each position corresponding to the respective pitch, the angular displacement of the conveyed workpiece 5 as well as of the holding device 3 due to yawing can be corrected. Specifically, the correction is performed as follows. The eccentric shaft member 35 is rotated by the driving motor 33 of the rear support mechanism 31, such that the eccentric shaft 38 is rotated around the rear drive shaft (rear rotating shaft) 36 by the angle $\theta_1$. As a result, at the position of the rear support mechanism 31, the upper plate 20 of the holding device 3 is moved in the direction Y perpendicular to the workpiece feeding direction X by a predetermined amount, and thereby the inclination error of the conveyed workpiece 5 relative to the workpiece feeding direction X can be corrected as shown in FIG. 8. At the time, the distance $L_3$ changes corresponding to an angular change of the axis (central axis) $O_1$ of the rear drive shaft 36 of the rear support mechanism 31 relative to the axis (central axis) $O_2$ of the front drive shaft 37 of the front support mechanism 32. Such displacement is absorbed since the sliding member 40 slides in the workpiece feeding direction X along the sliding guides 41.

Figure 9:
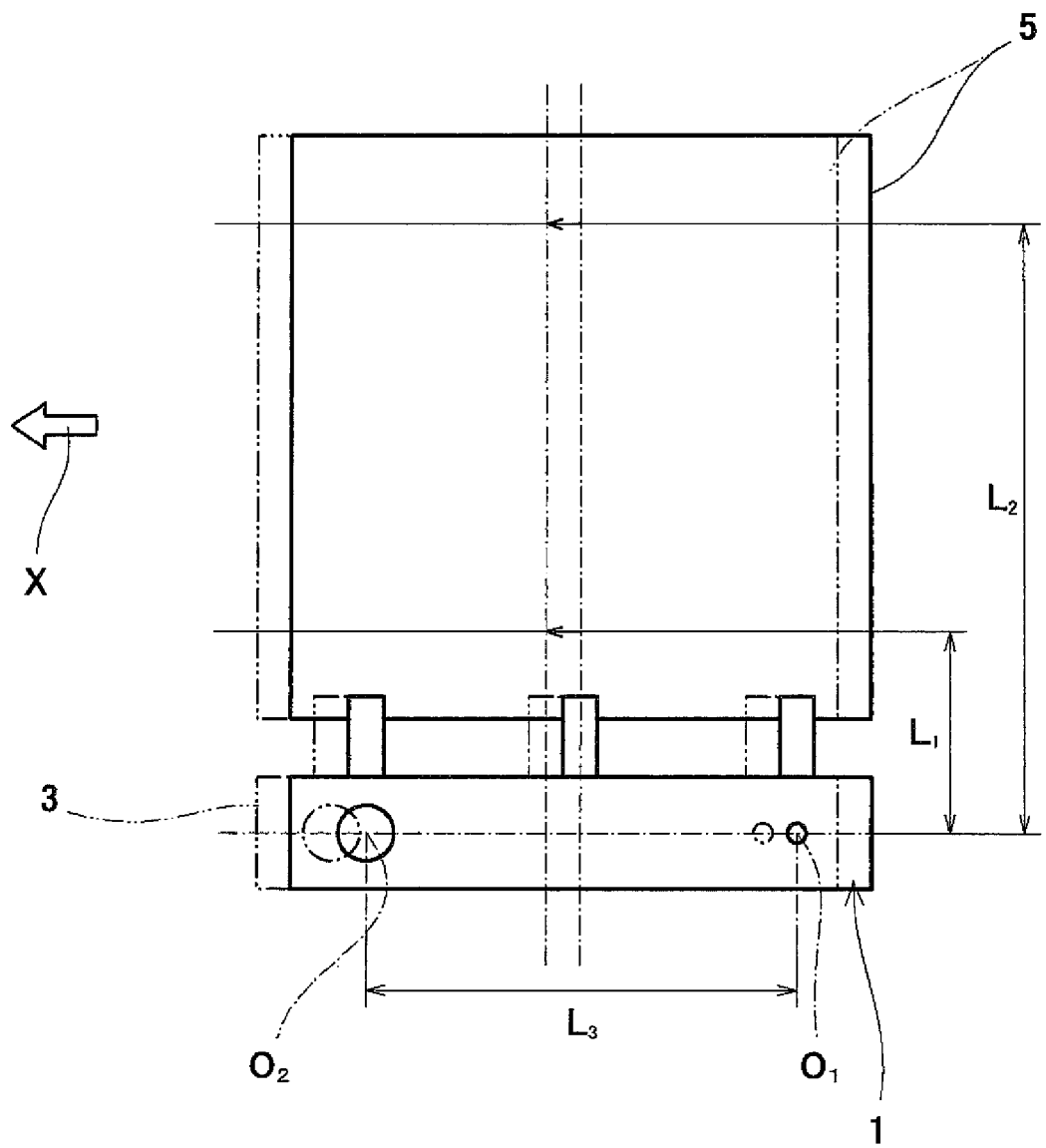
FIG. 9 is a plan view showing, in an exaggerated manner, the conveyed workpiece in a state where the yawing correction shown in FIG. 8 has been performed.

By performing the correction as described above, the inclination of the conveyed workpiece 5 can be corrected. However, the conveyed workpiece 5 still has an error in the workpiece feeding direction (front-rear direction) X as shown in FIG. 9. In this example, $\Delta X$ represents a workpiece conveyance error at the first error measurement point and the second error measurement point, and the other signs are the same as those used in the above description.

As mentioned above, the eccentricity amount e of the eccentric shaft member 35 is significantly less than the distance $L_3$ between the drive shaft (rotating shaft) 36 of the front support mechanism 32 and the drive shaft (rotating shaft) 37 of the rear support mechanism 31. Accordingly, the eccentricity amount e can be considered as $e \ll L_3$, and a displacement in the workpiece feeding direction relative to the inclination angle $\alpha_0$ of the conveying apparatus 1 is represented by Math. 1.

Then, a correction angle $\theta_2$ at the position of the front drive shaft 37 of the front support mechanism 32 of the conveying apparatus 1 can be obtained by Math. 8 shown below based on Math. 1.

$$\theta_2 = \cos^{-1} \frac{\Delta X}{e} \quad \text{[Math. 8]}$$

The correction as described above can be performed in the following manner: dividing the conveyance distance of the conveyed workpiece 5 (i.e., the moving distance of the conveying apparatus 1) into a plurality of pitches; measuring the errors $\Delta X_1$ and $\Delta X_2$ at each position corresponding to the respective divided pitch; and calculating the angle $\theta_2$ based on the measurement results. Therefore, the error $\Delta X$ may be obtained in advance at each position corresponding to the respective divided pitch, and then, the correction angle $\theta_2$ at each position corresponding to the respective divided pitch can be calculated by Math. 8.

Figure 10:
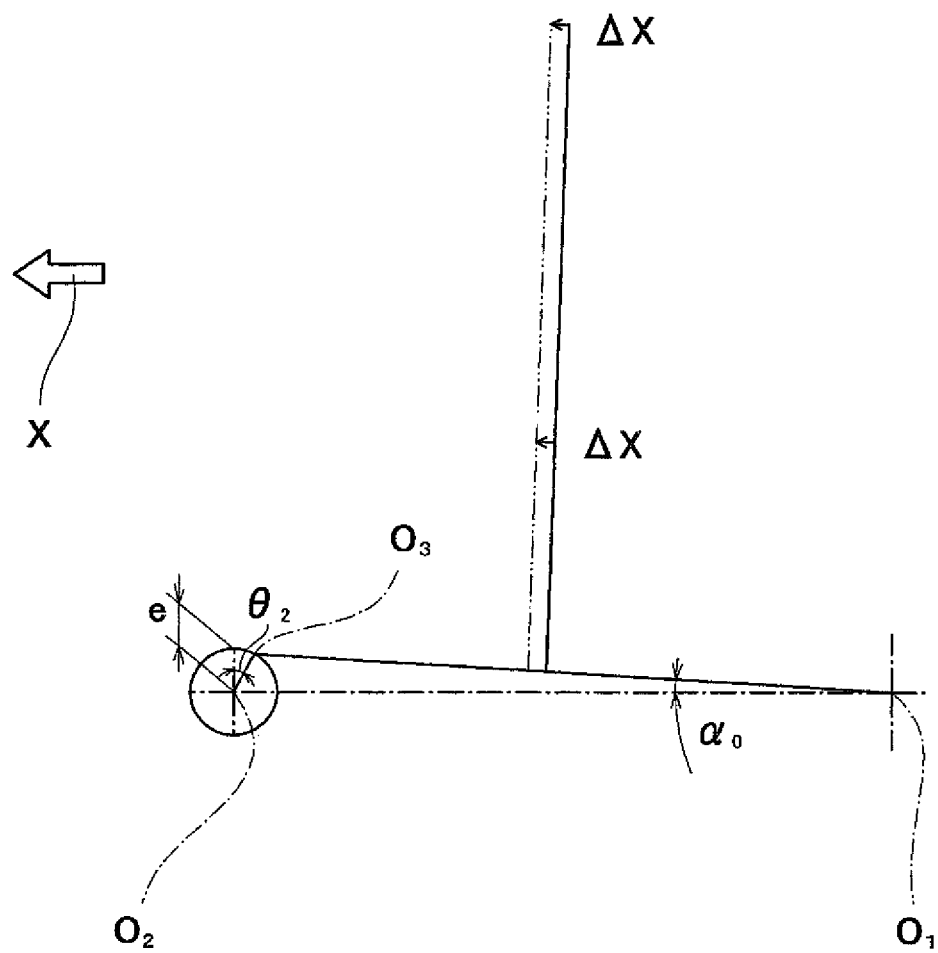
FIG. 10 is a plan view showing the concept of a method of correcting yawing of the conveyed workpiece of FIG. 9.

Accordingly, by correcting the angle $\theta_2$ at each position corresponding to the respective pitch, front-rear movement of the conveyed workpiece 5 as well as of the holding device 3 due to yawing can be corrected. Specifically, the correction is performed as follows. The eccentric shaft member 35 is rotated by the driving motor 33 of the front support mechanism 32, such that the eccentric shaft 38 is rotated around the front drive shaft (front rotating shaft) 37 by the angle $\theta_2$. As a result, at the position of the front support mechanism 32, the upper plate 20 of the holding device 3 is moved in the workpiece feeding direction X by a predetermined amount, and thereby the front-rear directional error of the conveyed workpiece 5 in the workpiece feeding direction X can be corrected as shown in FIG. 10. At the time, the sliding member 40 of the rear support mechanism 31 slides in the workpiece feeding direction X along the sliding guides 41, thereby absorbing the displacement.

Moreover, in the holding device 3, by performing the correction of rotating the eccentric shaft 38 around the axis (central axis) $O_1$ of the rear drive shaft (rotating shaft) 36 and the correction of rotating the eccentric shaft 38 around the axis (central axis) $O_2$ of the front drive shaft (rotating shaft) 37 consecutively, the yawing of the conveyed workpiece 5 occurring within the conveyance distance can be corrected promptly.

When performing the correction of the angle $\theta_1$ and the angle $\theta_2$, even the correction of, for example, a minute angle of about 0.01° can bring a great advantageous effect, depending on the distance $L_3$ between the front rotating shaft central axis and the rear rotating shaft central axis of the conveying apparatus 1, the eccentricity amount e of the eccentric shaft 38, the size of the conveyed workpiece 5, etc.

In the above-described embodiment, the angle $\theta_2$ is corrected after the angle $\theta_1$ is corrected. However, as an alternative, the angle $\theta_1$ may be corrected after the angle $\theta_2$ is corrected.

Figure 11:
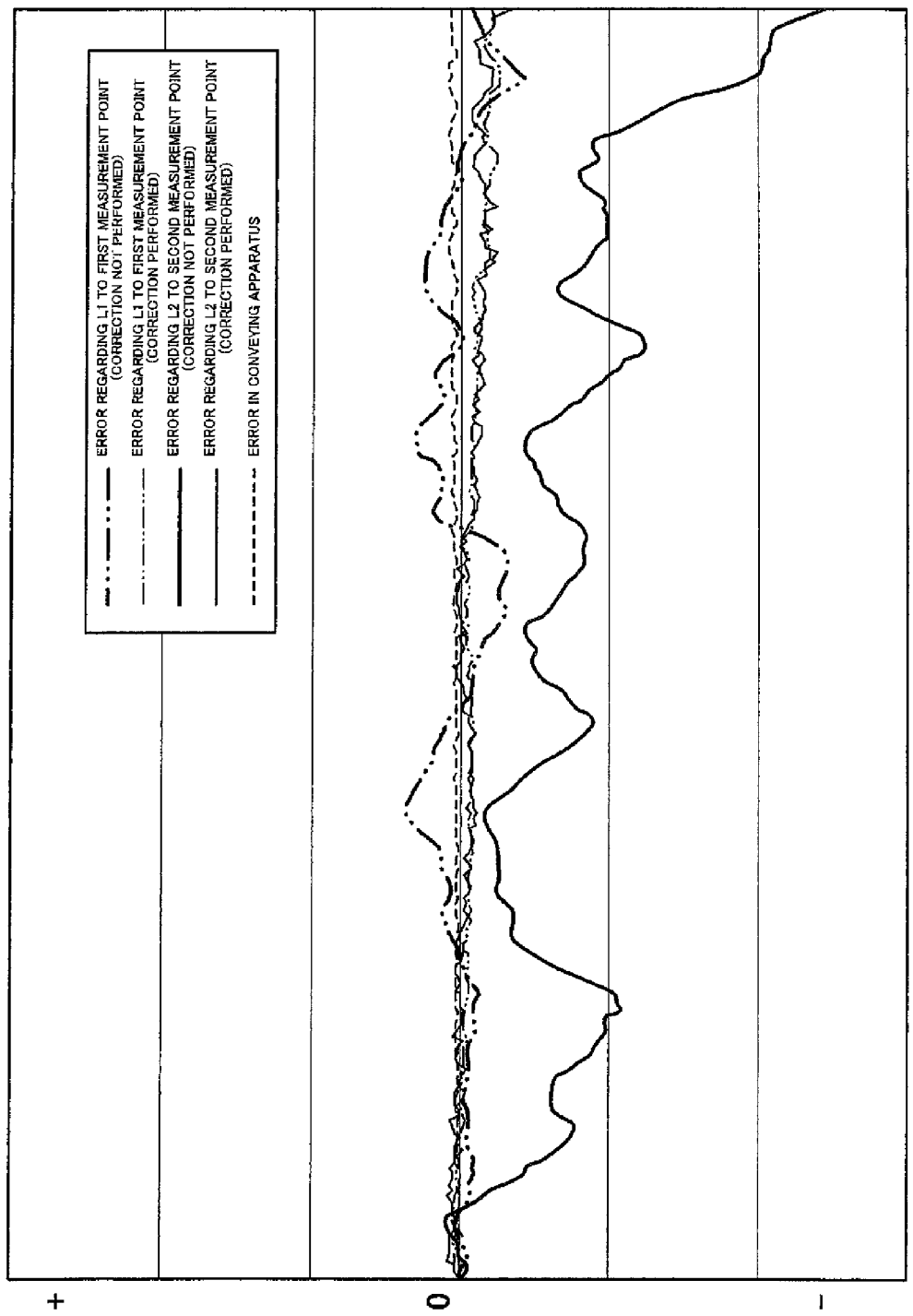
FIG. 11 is a graph showing amounts of yawing in a case where the yawing correction of the conveyed workpiece shown in FIGS. 7 to 10 has been performed and in a case where the yawing correction has not been performed.
Figure 12A:
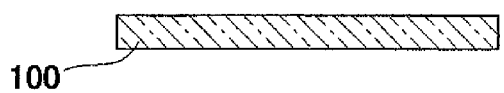
FIGS. 12A to 12G are sectional views showing an example of patterning performed by a conventional laser machining device.
Figure 12B:
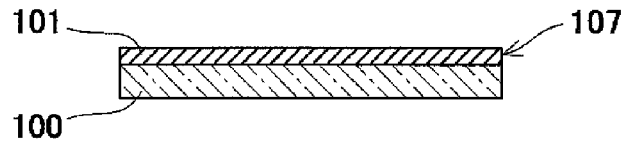
Figure 12C:
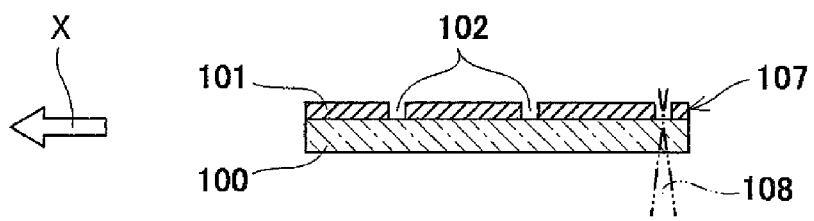
Figure 12D:
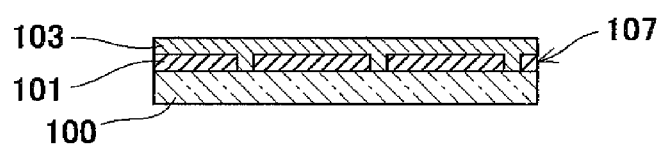
Figure 12E:
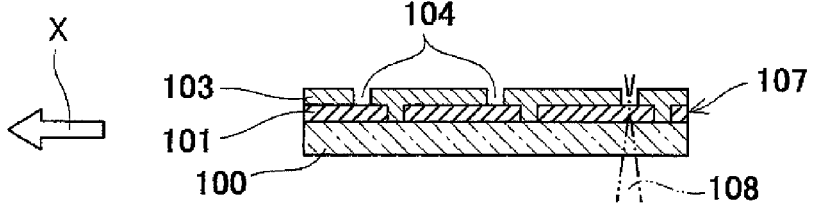
Figure 12F:
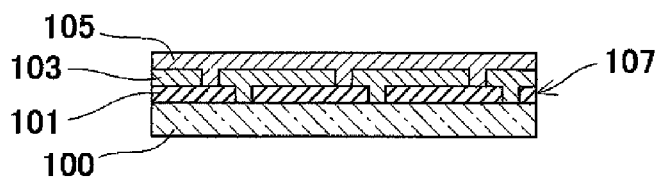
Figure 12G:
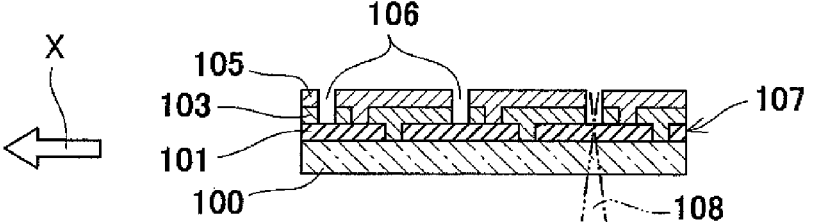

In FIG. 11, a bold two-dot chain line represents a case where the above-described correction has not been performed regarding the distance $L_1$ to the first error measurement point, and a thin two-dot chain line represents a case where the above-described correction has been performed regarding the distance $L_1$. Thus, it is clear from FIG. 11 that, by performing the above-described correction, the yawing of the conveyed workpiece 5 can be stably reduced.

Also, in FIG. 11, a bold solid line represents a case where the above-described correction has not been performed regarding the distance $L_2$ to the second error measurement point, and a thin solid line represents a case where the above-described correction has been performed regarding the distance $L_2$. Thus, it is clear from FIG. 11 that, by performing the above-described correction, an error of several hundred μm can be reduced to an error of several μm, for example. That is, the yawing of the conveyed workpiece 5 can be reduced significantly.

As described above, according to the conveying apparatus 1 including the yawing correcting mechanism 50, the yawing of the conveyed workpiece 5 can be corrected, by performing the angular correction of the conveyed workpiece 5 and the front-rear directional correction of the conveyed workpiece 5. This makes it possible to convey the conveyed workpiece 5 while suppressing slight yawing of the conveyed workpiece 5.

In addition, even in a case where precise machining of the conveyed workpiece 5 is required while the workpiece 5 is being conveyed at a high speed, since the workpiece 5 can be stably conveyed by continuously correcting the yawing, various machining of the conveyed workpiece 5 can be performed with improved precision.

Accordingly, even in a device configured to perform laser beam patterning precisely at a high speed on such a conveyed workpiece 5 as a thin-film solar cell substrate as mentioned above, the precision of the patterning can be improved. In addition, even if the patterning is performed multiple times on multiple layers as described above, the patterning can be performed with high precision. This makes it possible to improve the quality of the workpiece.

In the above-described embodiment, a thin-film solar cell substrate is taken as one example of the conveyed workpiece 5. However, the conveyed workpiece 5 is not limited to the one described in the above embodiment. The correction of yawing of the conveyed workpiece 5 can be performed in the above-described manner, so long as the conveyed workpiece 5 is a plate-shaped workpiece such as a thin metal plate or a panel.

Further, in the above-described embodiment, the correction in the direction Y crossing the workpiece feeding direction X is performed at the rear part of the conveying apparatus 1, and the correction in the workpiece feeding direction X is performed at the front part the conveying apparatus 1. However, such way of correction described in the above embodiment is a non-limiting example. As an alternative, the correction in the workpiece feeding direction X may be performed at the rear part of the conveying apparatus 1, and the correction in the direction Y crossing the workpiece feeding direction X may performed at the front part of the conveying apparatus 1.

Still further, for example, the positional relationship between the running device 2 and the holding device 3 of the conveying apparatus 1 is not limited to the one described in the above embodiment. As an alternative, the holding device 3 may be positioned under the running device 2.

The above-described embodiment merely indicates examples. Various changes may be made without departing from the spirit of the present invention. Thus, the present invention is not limited to the above-described embodiment.

INDUSTRIAL APPLICABILITY

The mechanism for correcting yawing of a conveyed workpiece according to the present invention is applicable to, for example, a conveying apparatus that is required to be able to precisely correct yawing that occurs when conveying a workpiece such as a thin plate material.

REFERENCE SIGNS LIST

1 conveying apparatus
2 running device
3 holding device
5 conveyed workpiece
6 rail
10 lower plate
11 running guide
12 linear stepping motor
13 restricting member
20 upper plate
21 holding member
22 distal-end holder
23 thrust bearing
30 support mechanism
31 front support mechanism
32 rear support mechanism
33 driving motor (servomotor)
34 support bearing
35 eccentric shaft member
36 rear drive shaft (rear rotating shaft)
37 front drive shaft (front rotating shaft)
38 eccentric shaft
40 sliding member
41 sliding guide
42 sliding mechanism
50 yawing correcting mechanism
X workpiece feeding direction
Y crossing direction
s gap
$O_1$ drive shaft axis (central axis)
$O_2$ drive shaft axis (central axis)
$O_3$ eccentric shaft axis (central axis)
$L_1$ distance from rotating shaft central axis position of conveying apparatus to first error measurement point of conveyed workpiece
$L_2$ distance from rotating shaft central axis position of conveying apparatus to second error measurement point of conveyed workpiece
$L_3$ distance between front rotating shaft central axis and rear rotating shaft central axis of conveying apparatus
$\Delta X_1$ workpiece conveyance error at first error measurement point
$\Delta X_2$ workpiece conveyance error at second error measurement point
e eccentricity amount of eccentric shaft
$\theta_1$ eccentricity angle of eccentric shaft
$\theta_2$ eccentricity angle of eccentric shaft

The invention claimed is:

1. A yawing correcting mechanism for correcting yawing of a conveyed workpiece conveyed in a workpiece feeding direction, the mechanism comprising:
 a holding device configured to hold a side portion of the conveyed workpiece;
 a running device configured to support the holding device and convey the holding device in the workpiece feeding direction along a rail; and
 a support mechanism configured to support the holding device at a front portion and a rear portion of the support mechanism, the front portion and the rear portion being arranged in the workpiece feeding direction of the running device, wherein
 the support mechanism includes:
  rotating shafts included in one of the holding device and the running device; and
  eccentric shafts included in the other one of the holding device and the running device, the eccentric shafts including respective axes parallel to the corresponding rotating shafts, the axes of the eccentric shafts being disposed at respective positions such that, at one of the positions, one of the front portion and the rear portion is eccentric relative to an axis of the corresponding rotating shaft in the workpiece feeding direction by a predetermined eccentricity amount, and at the other position, the other one of the front portion and the rear portion is eccentric relative to an axis of the corresponding rotating shaft in a direction crossing the workpiece feeding direction by a predetermined eccentricity amount, and
 the yawing correcting mechanism is configured to correct the yawing of the conveyed workpiece by rotating the axes of the eccentric shafts around the axes of the rotating shafts, such that the holding device moves relative to the running device.

2. The yawing correcting mechanism according to claim 1, wherein the eccentric shafts are disposed such that one of the eccentric shafts is eccentric relative to the corresponding rotating shaft in the workpiece feeding direction, and the other eccentric shaft is eccentric relative to the corresponding rotating shaft in a direction perpendicular to the workpiece feeding direction.

3. The yawing correcting mechanism according to claim 1, wherein
the running device includes a driver configured to rotate the rotating shafts,
the holding device includes engagement portions engaged with the eccentric shafts,
the driver is configured to rotate the rotating shafts based on an eccentricity amount in a direction perpendicular to the workpiece feeding direction, the eccentricity amount being measured in advance between the running device and the rail, such that the eccentric shafts cause the holding device to move relative to the running device to correct the yawing of the conveyed workpiece.

4. A yawing correcting method of correcting yawing of a conveyed workpiece conveyed in a workpiece feeding direction, the yawing correcting method comprising:
obtaining an amount of yawing of the conveyed workpiece between a conveyance start point and a conveyance end point; and
correcting the yawing by causing a holding device to move relative to a running device based on the obtained amount of yawing of the conveyed workpiece, wherein correcting the yawing includes:
performing correction in a direction crossing the workpiece feeding direction of the conveyed workpiece by rotating an eccentric shaft around a rotating shaft,
the rotating shaft being included in one of the holding device and the running device, the holding device being configured to hold the conveyed workpiece,
the running device being configured to convey the holding device in the workpiece feeding direction,
the eccentric shaft being included in the other one of the holding device and the running device, the eccentric shaft being eccentric relative to the rotating shaft in the workpiece feeding direction by a predetermined eccentricity amount; and
performing correction in the workpiece feeding direction of the conveyed workpiece by rotating an eccentric shaft around an axis of a rotating shaft,
the rotating shaft being included in one of the holding device and the running device,
the eccentric shaft being included in the other one of the holding device and the running device, the eccentric shaft being eccentric relative to the rotating shaft in the direction crossing the workpiece feeding direction by a predetermined eccentricity amount.

5. The yawing correcting method according to claim 4, wherein
the correction in the direction crossing the workpiece feeding direction is performed by rotating an axis of the eccentric shaft that is eccentric in the workpiece feeding direction around the axis of the corresponding rotating shaft, and thereafter
the correction in the workpiece feeding direction is performed by rotating an axis of the eccentric shaft that is eccentric in the direction crossing the workpiece feeding direction around the axis of the corresponding rotating shaft.

6. The yawing correcting method according to claim 4, wherein
correcting the yawing is performed during a process, the process including, while feeding a thin-film solar cell substrate as the conveyed workpiece in the workpiece feeding direction, performing laser beam patterning at a predetermined position on the conveyed workpiece to form a scribe line, such that the position on the conveyed workpiece, at which the patterning is performed, is corrected.

* * * * *